United States Patent [19]

Wada

[11] Patent Number: 5,521,417

[45] Date of Patent: May 28, 1996

[54] SEMICONDUCTOR DEVICE COMPRISING A NON-VOLATILE MEMORY FORMED ON A DATA PROCESSOR

[75] Inventor: Masashi Wada, Yokohama, Japan

[73] Assignee: Kabushiki Kaisha Toshiba, Kawasaki, Japan

[21] Appl. No.: 332,377

[22] Filed: Jan. 19, 1993

Related U.S. Application Data

[63] Continuation of Ser. No. 771,531, Oct. 7, 1991, abandoned, which is a continuation of Ser. No. 492,835, Mar. 13, 1990, abandoned.

[30] Foreign Application Priority Data

Mar. 14, 1989 [JP] Japan .................................. 1-61559

[51] Int. Cl.$^6$ ..................... H01L 29/76; H01L 29/94; H01L 31/062; H01L 31/113
[52] U.S. Cl. ..................... 257/390; 257/369; 257/370
[58] Field of Search ............................. 365/96, 104, 105, 365/61, 63, 65, 145; 257/390, 369, 370; 357/51

[56] References Cited

U.S. PATENT DOCUMENTS

| | | | |
|---|---|---|---|
| 2,905,928 | 9/1959 | Anderson | 365/105 |
| 4,149,302 | 4/1979 | Cook | 29/25.42 |
| 4,233,671 | 11/1980 | Gereberg et al. | 365/105 |
| 4,424,579 | 1/1984 | Roesrer | 365/105 |
| 4,458,297 | 7/1984 | Stopper et al. | 361/403 |
| 4,823,181 | 4/1989 | Moshen et al. | 357/51 |
| 4,888,630 | 12/1989 | Paterson | 357/23.5 |

FOREIGN PATENT DOCUMENTS

| | | | |
|---|---|---|---|
| 0073486 | 9/1983 | European Pat. Off. | 365/51 |
| 0075945 | 6/1993 | European Pat. Off. | 357/23.1 |
| 52-104882 | 9/1977 | Japan . | |
| 58-46680 | 3/1983 | Japan . | |
| 61-198754 | 9/1986 | Japan . | |
| WO86/04447 | 7/1986 | WIPO | 357/23.6 |

OTHER PUBLICATIONS

*Electronic Engineering*, "Technology Focus Memory Devices", vol. 60, No. 737, May 1988, Woolwich, London, Great Britain.

Kurokawa, et al. "3–D VLSI Technology in Japan and an Example: a Syndrome Decoder for Double Error Correction", FGCS. Further, Generation, Computer, Systems, vol. 4, No. 2, Sep. 1988, Amsterdam, The Netherlands, pp. 145–155.

Sato et al., "A New Cell For High Capacity Mask ROM By The Double Locos Technique," IEDM 1983, Technical Digest, pp. 581–584.

*Primary Examiner*—Stephen D. Meier
*Attorney, Agent, or Firm*—Foley & Lardner

[57] ABSTRACT

A semiconductor device with a non-volatile memory on a data processing block, having a semiconductor substrate (100); a data processing block (202) having active elements for performing data processing and formed directly on the semiconductor substrate (100); and a memory block (206, 302) for previously storing information necessary for performing the data processing. The passive memory cell array (302) is formed above the active data processing block (202) and the active peripheral circuit (206), with an insulating passivation film (110) interposed therebetween. The memory block includes a memory cell array (302) having a plurality of memory cells as passive elements and a peripheral circuit (206) having active elements for reading data from the memory cell array. The memory cell array (302) has a plurality of conductors (112) in the X direction and conductors (115) in the Y direction, respectively to be selected by the peripheral circuit (206). The X and Y direction conductors (112, 115) are formed as two upper and lower layers with an insulating film (113) interposed therebetween. The X and Y direction conductors are three-dimensionally intersected to form the memory cells.

1 Claim, 4 Drawing Sheets 5,521,417

SEMICONDUCTOR DEVICE COMPRISING A NON-VOLATILE MEMORY FORMED ON A DATA PROCESSOR

This application is a continuation of application Serial No. 07/771,531, filed Oct. 7, 1991 now abandoned, which is a continuation of 07/492,835, filed Mar. 13, 1990, now abandoned.

FIELD OF THE INVENTION

The present invention relates to a semiconductor device formed on a semiconductor substrate, and more particularly to a semiconductor device wherein elements for processing information and elements for storing information are formed on a single semiconductor substrate.

BACKGROUND OF THE INVENTION

With recent developments in semiconductor technology, a semiconductor device has been practically realized which has a great number of functional elements formed on a single semiconductor substrate. For example, there has been realized a semiconductor device having within its semiconductor substrate a CPU (Central Processing Unit) for performing logical operations, data control and the like, a ROM (Read Only Memory) for storing fixed data such as the operating system (OS) and the like, a RAM (Random Access Memory) for storing temporary data, and other elements. Such a semiconductor device includes almost all functional elements necessary for a computer in one chip. A very compact device with great information processing capability is thus realized and has wide application such as in IC cards.

It has been desired to have such a semiconductor device with more sophisticated functions as its memory capacity increases and its logical circuits become large scaled circuits. The reason for this is that devices which can process more information at higher speeds are becoming necessary. In order to meet such requirements, it is necessary to integrate elements as much as possible on a single semiconductor substrate. It therefore becomes necessary to make each element smaller. If this is not possible, the chip area will increase to pose a number of problems associated with manufacturing techniques, resulting in difficulty in mass-producing such devices at a low cost.

In order to make an element small, precise control of lithography should be unsured and measures should be taken to account for degradation of reliability to be caused by miniaturization which results in difficulties associated with manufacturing techniques.

SUMMARY OF THE INVENTION

The present invention has been made in consideration of the above problems. It is an object of the present invention to provide a semiconductor device having both a large memory capacity and a highly sophisticated information processing capability and formed on a single semiconductor substrate without any increase of the chip area and without the need of extreme miniaturization of elements.

There are laminated, as an upper layer and lower layer on a single semiconductor substrate, a first functional block for data processing and a memory cell array of a second functional block for storage of various information necessary for data processing. The overall dimensions of the semiconductor device can be made small when compared with a device which forms both the first and second functional blocks on the same surface. The miniaturization of the semiconductor device can be achieved without reducing the size of the each of semiconductor elements constituting the first and second functional blocks too much. There is no need therefore to miniaturize each semiconductor element, and hence there is no fear of lowering the reliability which might be caused by miniaturization.

According to the present invention, the information necessary for data processing by the first functional block is previously stored in the memory cell array.

According to the present invention, virtual intersections (three-dimensional intersections) between conductors in the X- and Y-directions are optionally made conductive, or the state of ferroelectric members at virtual intersections is optionally changed. Accordingly, the information necessary for data processing by the first functional block can be previously stored in the memory cell array of the second functional block. In other words, the information necessary for a particular user of this device can be previously stored in the memory cell array.

According to the present invention, the overall dimensions of a semiconductor device can be made small without reducing the size of each semiconductor element too small. In addition, since it is not necessary to make each element small, the difficulties in manufacturing are not increased, thereby not only allowing devices of low cost but also presenting no fear of lowering the reliability which might be caused through miniaturization. Furthermore, the memory capacity can be increased and the data processing functions can be highly sophisticated assuming that a device having the same dimensions as a conventional one is used.

According to the present invention, the information necessary for data processing can be previously stored in the memory cell array.

According to the present invention, a user can optionally store in the memory cell the information necessary for data processing, and in addition, information once stored can be rewritten.

DESCRIPTION OF THE PREFERRED EMBODIMENTS

The embodiments of the present invention will be described with reference to the accompanying drawings.

Figure 1:
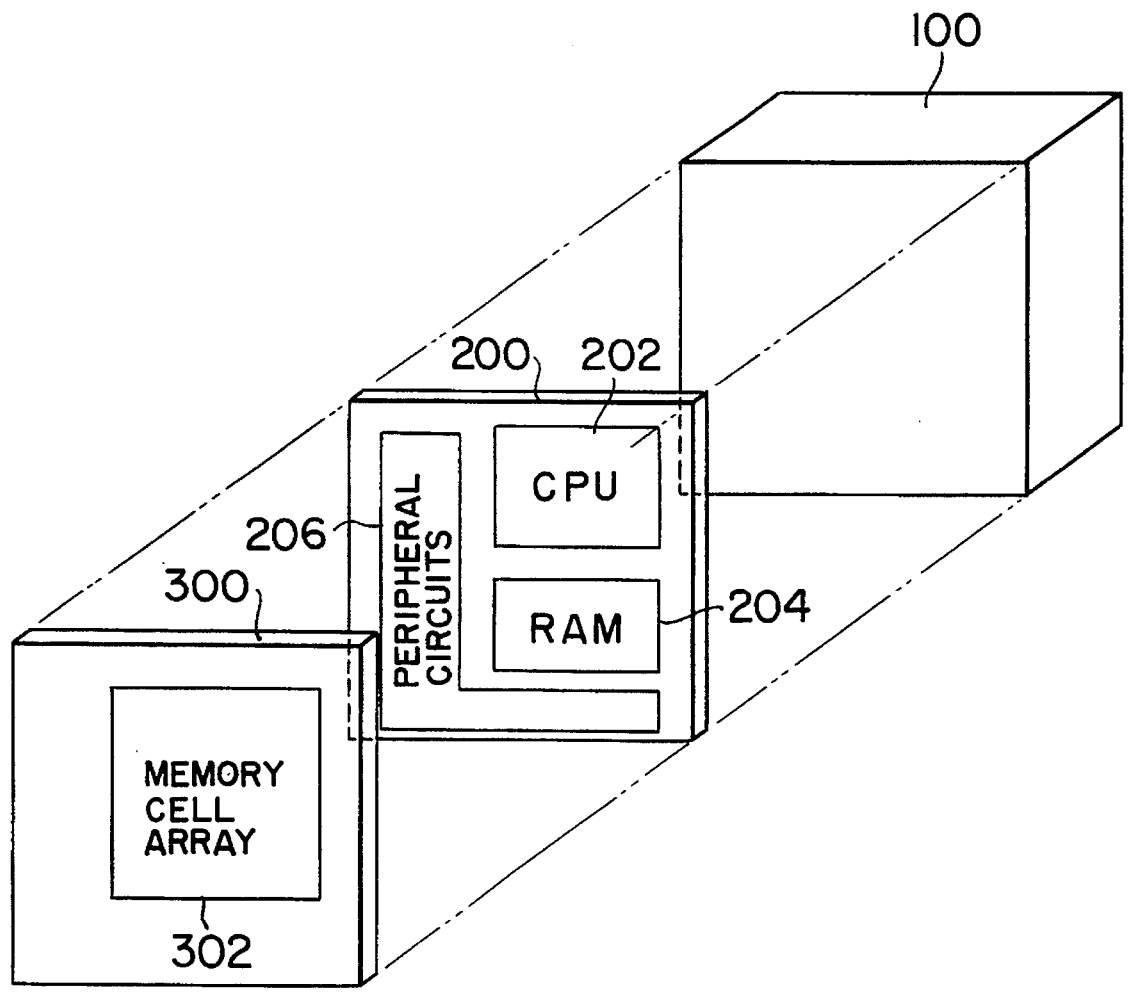
FIG. 1 is a schematic view illustrating the concept of the present invention.

FIG. 1 is a schematic view illustrating the concept of the present invention. As seen from FIG. 1, the embodiment of the semiconductor device has a lower layer 200 and an upper layer 300 laminated one upon the other on a semiconductor substrate 100. The lower layer 200 includes a first functional block (data processing section) and a part (constructed of transistors) of a second functional block (memory section). The upper layer 300 includes the remaining part (not including transistors) of the second functional block. The first functional block performs logical operations, data control and the like, and is shown as a CPU 202 in FIG. 1. The second functional block is used for storing information, a part of the second functional block being shown in FIG. 1 as a memory cell array 302 of a ROM in the upper layer 300 and a RAM 204 and a peripheral circuit (decoder, control unit, input/output unit and the like) 206 of ROM in the lower layer 200.

Figure 2A:
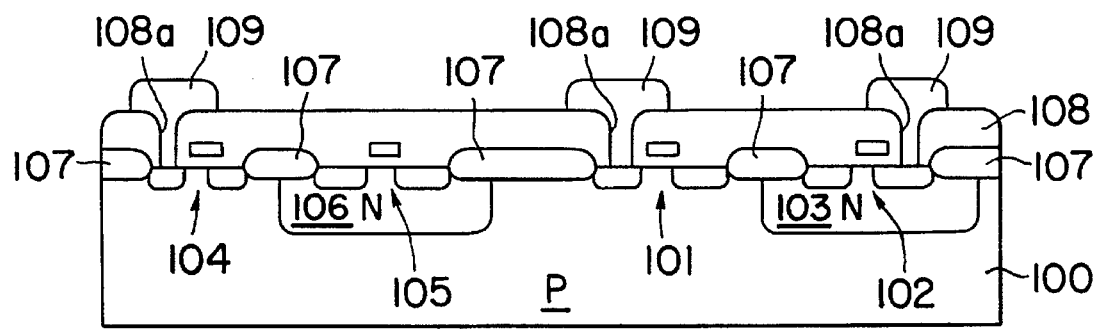
FIGS. 2A to 2C are cross sections illustrating the manufacturing processes for a semiconductor device according to an embodiment of the present invention.
Figure 2B:
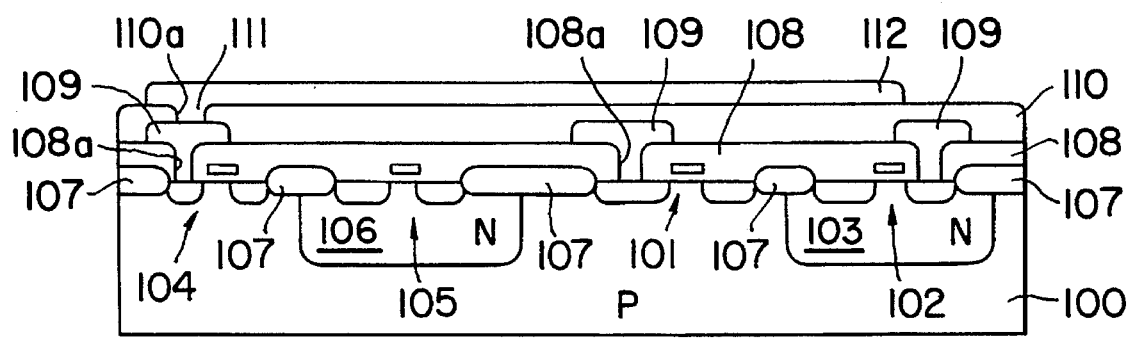
Figure 2C:
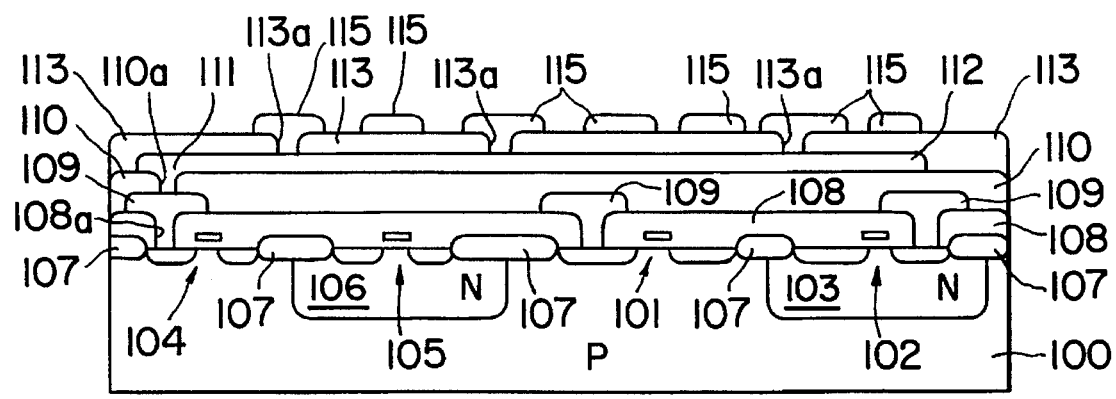

FIGS. 2A to 2C are cross sections illustrating the manufacturing processes for a semiconductor device according to the first embodiment which is an example of the device conceptually shown in FIG. 1.

The first embodiment operates as a mask ROM. As shown in FIG. 2A, there are formed on a semiconductor substrate (P-type silicon substrate) 100 an N-channel transistor 101 and P-channel transistor 102 as the data processing section. Reference numeral 103 represents an N-type well provided for the P-channel transistor 102. There are also formed on the surface of the silicon substrate 100 an N-channel transistor 104 and a P-channel transistor 105 which constitute the peripheral circuit of the memory section, e.g., a decoder, control unit, input/output unit and the like. Reference numeral 106 represents an N-type well provided for the P-channel transistor 105. These elements are electrically isolated from each other by field oxide 107, 107, . . . . Reference numeral 108 represents a passivation film deposited for protecting the elements, the passivation film being made of SiO₂ or PSG formed by a CVD method. Contact holes 108a, 108a, . . . are formed in the passivation film 108 where necessary, and conductor material 109 is provided within the holes for interconnection between elements.

Figure 3:
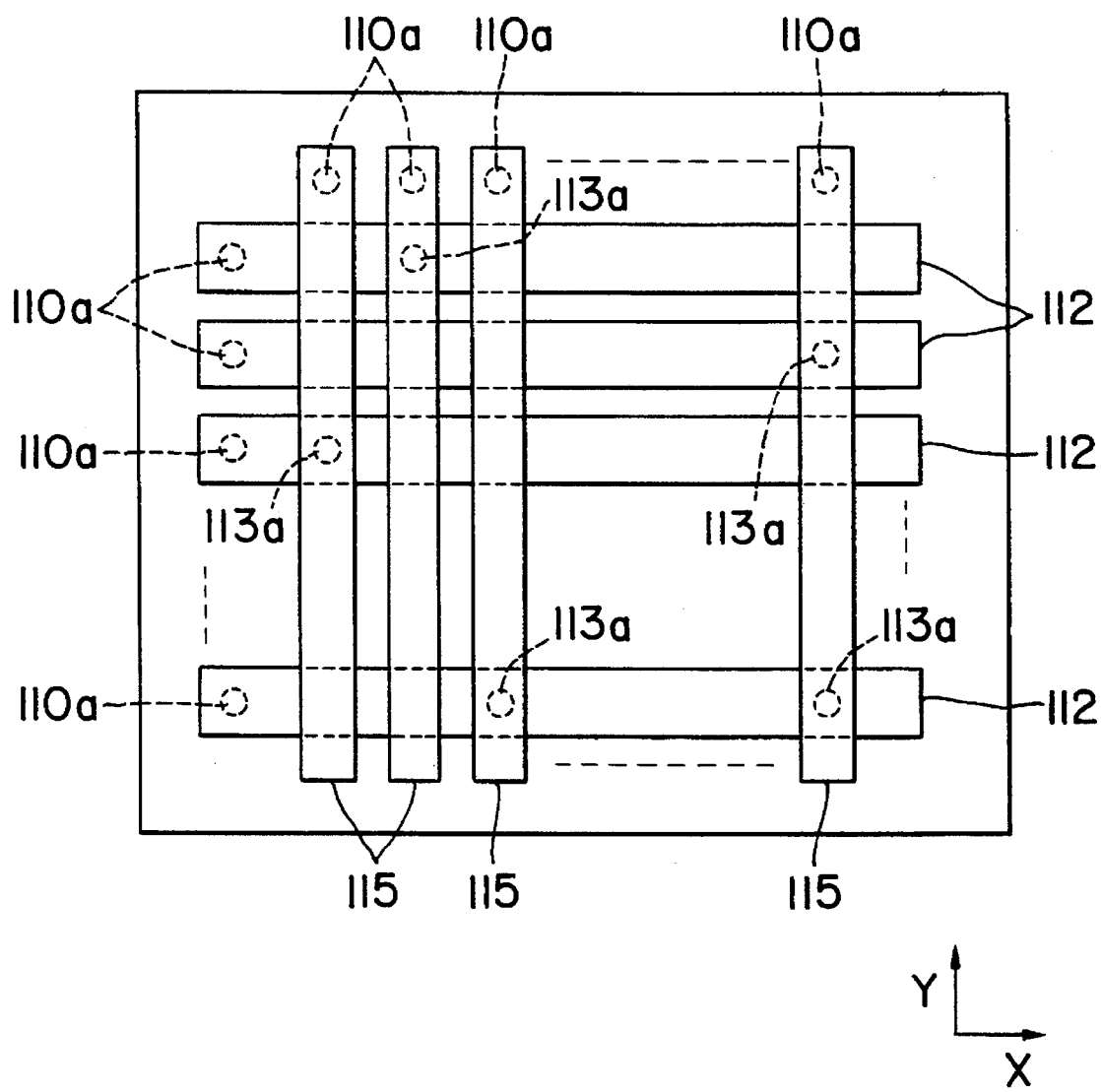
FIG. 3 is a schematic view illustrating first and second conductor shown in FIG. 2C.

Next, as shown in FIG. 2B, a passivation film 110 is deposited on the passivation film 108 and conductor material 109. Contact holes 110a, 110a, . . . are formed in the passivation film 110 for connection to the conductors of decoder outputs for the memory section, the contact holes 110a, 110a, . . . being disposed as shown in FIG. 3 substantially in an L-character shape. Next, first metals (or semiconductor layers) 112, 112, . . . are deposited in parallel with each other as shown in FIG. 3 while being connected to the conductor material 109 via the contact holes 110a, 110a, . . . .

Next, as shown in FIG. 2C, a passivation film 113 is deposited over the whole surface of the first metals 112 and passivation film 110. Contact holes 113a, 113a, . . . are formed in the passivation film 113 above the first metal 112 in accordance with the information to be written in the ROMs. As seen from FIG. 3, the contact holes are selectively formed at optional virtual or apparent intersections (three-dimensional intersections as viewed in the direction perpendicular to the X-Y surface) between the first and second metals 112 and 115. Then, the second metals (or semiconductor layers) 115, 115, . . . are deposited and patterned to be perpendicular to the first wirings as seen from FIG. 3. The end portions of the second metals are connected to the decoder outputs via the contact holes 110a, 110a, . . . . The interface at which the first and second metals (or semiconductor layers) contact each other within the contact holes 113a is formed with a p-n junction or Schottky junction so as to perform a rectification function.

The semiconductor device constructed as above operates as described in the following. Namely, the transistor type functional elements (data processing section) formed on the surface of the semiconductor substrate 100 perform information processing. Fixed information is stored in the memory cell array formed above the transistor type functional elements, and is read when necessary.

As seen from FIG. 2C, without increasing the chip area, it is possible to realize a semiconductor device having a highly sophisticated information processing capability and a large memory capacity.

In the above embodiment, the data processing section and the peripheral circuit of the memory section have been formed on the surface of the semiconductor substrate 100. Other memories such as RAMs also may be formed on the surface of the substrate 100.

Another embodiment will be described with reference to FIG. 4 which shows a semiconductor device functioning as a PROM. In the first embodiment shown in FIGS. 2A to 2C, contact holes 113a have been formed at the virtual intersections (three-dimensional intersections) between the first and second metals (or semiconductor layers) in accordance with information to be stored. In the second embodiment shown in FIG. 4, blind holes 113b, 113b are formed at all virtual intersections as shown in FIG. 4 while thin insulating films 113c, 113c, . . . are interposed between two metals 112 and 115.

In order to form such blind holes, there are many practical methods. For example, holes 113b are first formed to extend completely to the first metal 112, and then an insulating film is deposited over the whole surface of the semiconductor device. Alternatively, the surface of the first metal 112, exposed to the holes 113b, may be oxidized.

Figure 4:
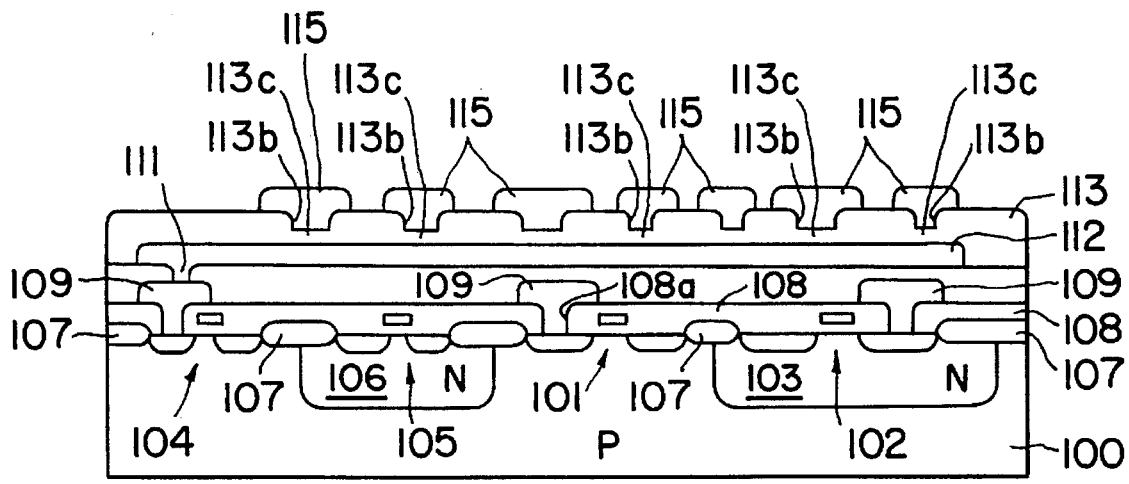
FIGS. 4 and 5 are cross sections of semiconductor devices according to other embodiments of this invention.

In writing information into the semiconductor device shown in FIG. 4, the thin insulating films 113c, 113c are selectively destroyed for example by applying a high voltage pulse (10 MV/cm). It is therefore possible for a user to write a desired program into a finished semiconductor device, thereby realizing a so-called PROM type semiconductor device.

A further embodiment of this invention will be described with reference to FIG. 5 which shows a semiconductor device functioning as an EEPROMo In the embodiment shown in FIG. 4, a PROM type semiconductor device has been realized by forming a thin insulating film 113c at the virtual intersections between the first and second metals (or semiconductor layers) 112 and 115. In the embodiment shown in FIG. 5, ferroelectric members 117, 117, . . . are formed in holes 113d, 113d, . . . at virtual intersections. In practice, a ferroelectric member 117 may be deposited over the whole area of the semiconductor device inclusive of the holes 113d, and thereafter the film is etched back. Or other suitable methods may be used. As the ferroelectric member 117, barium titanate ($BaTiO_3$), lead titanate zirconate (PZT: $PbTiO_3$-$PbZrO_3$) or the like may be used.

Figure 5:
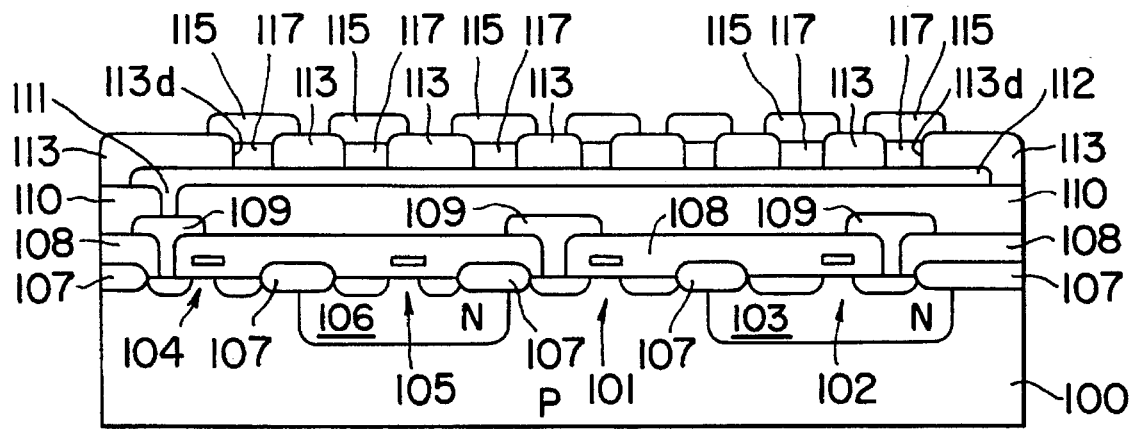

In the semiconductor device shown in FIG. 5, a high voltage is selectively applied to the intersections to thereby change the polarization direction of the ferroelectric member 117 and store information. In other words, the semiconductor device shown in FIG. 5 functions as a non-volatile RAM (EEPROM).

What is claimed is:

1. A semiconductor device, comprising:

a first functional block for processing data for logical operations and data control; and a second functional block for storing information required previous to the data processing, the first functional block being formed directly on a semiconductor substrate, the second functional block including functional elements which include a decoder and peripheral circuits, said functional elements being formed directly on the semiconductor substrate, the first functional block and the functional elements of the second functional block being formed by using a silicon layer of the semiconductor substrate as a part of the first functional block and the functional elements of the second functional block, a memory cell array being formed over the first functional block and the functional elements of the second functional block via a first insulating film which is not composed of a silicon material, the memory cell array being a non-functional element of the second functional block;

the memory cell array being formed into an approximately rectangular shape and further having a plurality of X-direction conductive wires and a plurality of Y-direction conductive wires formed via a second insulating film so as to be selected by the decoder, and the functional elements which include the decoder and the peripheral circuits being formed approximately into an L-shape having a top region and a bottom region substantially perpendicular to the top region in such a way that the top and bottom regions of the L-shaped functional elements are located outside and under two adjacent sides of the memory cell array, respectively, and wherein the X-direction conductive wires and the Y-direction conductive wires are spaced from each other, and at each intersection between the X- and Y-direction conductive wires there is positioned a ferroelectric substance that is polarized according to a direction of voltage applied thereto, said direction being approximately perpendicular to an X-Y plane in which the X- and Y-direction conductive wires are disposed.

* * * * *